United States Patent [19]
Quan

[11] Patent Number: 4,963,764
[45] Date of Patent: Oct. 16, 1990

[54] LOW NOISE CURRENT MIRROR ACTIVE LOAD CIRCUIT

[75] Inventor: Ronald Quan, Cupertino, Calif.

[73] Assignee: Hewlett-Packard Company, Palo Alto, Calif.

[21] Appl. No.: 330,953

[22] Filed: Mar. 23, 1989

Related U.S. Application Data

[63] Continuation of Ser. No. 47,694, May 8, 1987, abandoned.

[51] Int. Cl.$^5$ .......................... G05F 3/16; H03K 3/01
[52] U.S. Cl. .................................... 307/270; 307/542; 307/296.1; 330/288; 323/315
[58] Field of Search ............ 307/270, 542, 297, 296.1, 307/296.6; 323/312, 315, 316; 330/288, 289

[56] References Cited

U.S. PATENT DOCUMENTS 3,392,342 7/1968 Ordower ............................. 330/288
4,565,959 1/1986 Nagano ................................ 323/315

FOREIGN PATENT DOCUMENTS 2157756 6/1972 Fed. Rep. of Germany ...... 323/315
0196319 12/1982 Japan .................................. 323/315
0037719 3/1983 Japan .................................. 323/315
0216305 12/1984 Japan .................................. 330/288

OTHER PUBLICATIONS

Interdesign Inc., "101 Analog IC Designs", 1976, pp. 25-32.
Another Entrant in OP-AMP Sweepstakes, *Electronics*, Apr. 28, 1969, p. 140.

Primary Examiner—Timothy P. Callahan

[57] ABSTRACT

A low noise integrated active load circuit in a current mirror configuration attenuates the noise introduced into the output current by transistors in the bias side of the circuit. Adding transistors on the bias side attenuates the noise introduced into the output side by the reciprocal of the number of bias transistors (1/n) due to the current mirror configuration. Because of the way independent noise sources add statistically as the square root of the sum of the squares of the individual noise sources, the attenuation increases faster than the net noise contributed by the multiple transistors.

4 Claims, 7 Drawing Sheets

LOW NOISE CURRENT MIRROR ACTIVE LOAD CIRCUIT

CROSS REFERENCE TO RELATED APPLICATION

This application is a continuation of application Ser. No. 07/047,694, filed May 8, 1987, now abandoned.

FIELD OF THE INVENTION

This invention relates to the field of bipolar integrated circuits. More particularly, this invention relates to the field of low noise active load circuits in bipolar integrated circuits.

BACKGROUND OF THE INVENTION

Electronic noise is an undesirable side effect of the operation of electronic circuits. Device switching and p-n junction operation are common sources of electronic noise in integrated circuits. The active load circuit 10 shown in FIG. 1 introduces electronic noise into the application circuit 12 that it loads. The active load circuit 10 has a voltage supply $V_{CC}$, load transistor $Q_{L1}$, load transistor $Q_{L2}$, bias resistor $R_L$ and circuit ground 14. $Q_{L1}$ and $Q_{L2}$ are PNP transistors. The emitter of $Q_{L1}$ is coupled to the voltage supply $V_{CC}$. The collector of transistor $Q_{L1}$ is coupled to the loading node 16. The base of transistor $Q_{L1}$ is coupled to the base and collector of transistor $Q_{L2}$ and to one terminal of the resistor $R_L$. The emitter of transistor $Q_{L2}$ is coupled to the voltage supply $V_{CC}$. The other terminal of the resistor $R_L$ is coupled to ground 14.

The application circuit 12 shown in the prior art FIG. 1 is a photodiode preamplifier circuit. The anode terminal of the photodiode 18 is coupled to ground 14 and the cathode terminal of the photodiode 18 is coupled to the base of transistor $Q_2$ and to one terminal each of the feedback resistor $R_F$ and the feedback capacitor $C_F$. The emitter of transistor $Q_2$ is coupled to a first biasing voltage level $V_E$. The collector of transistor $Q_2$ is coupled to the emitter of transistor $Q_1$. The base of transistor $Q_1$ is coupled to a second biasing voltage supply $V_B$. The collector of transistor $Q_1$ is coupled to loading node 16 and to the input of the gain-of-one amplifier 20. The output of the amplifier 20 is coupled to the output 22 of the photodiode preamplifier circuit 12 and to the other terminal of each of the feedback resistor $R_F$ and the feedback capacitor $C_F$. The output 22 is used to drive external circuitry which is not shown.

Referring to FIG. 2 one can see a technique to reduce the noise introduced by the load circuit. A load resistor $R_L$ replaces the active load circuit 10 of FIG. 1 and is coupled between the power supply $V_{CC}$ and the collector of transistor $Q_1$. Also such a resistive load must typically be a very high resistance, on the order of several hundred K$\Omega$ requiring much surface area on an integrated circuit. The base of transistor $Q_1$ is coupled to a biasing voltage $V_B$ and the emitter is coupled to the collector of transistor $Q_2$. The base of transistor $Q_2$ is coupled to an input voltage $V_{IN}$ and the emitter is coupled to a biasing voltage $V_E$.

If the circuit of FIG. 2 is designed to require a load current of 5 $\mu$A, the resistor is 760 K$\Omega$. Because the cost of manufacturing an integrated circuit is directly related to the area of the circuit, each of these prior art techniques of reducing noise resulting from an active load is undesirable. Where such techniques have been utilized typically the integrated circuit designer has required the user to attach an external resistor rather than integrating the large resistance into the device.

SUMMARY OF THE INVENTION

It is an object of the present invention to provide an active load circuit for an integrated circuit which has reduced noise introducing properties.

It is another object of the present invention to provide an active load circuit for an integrated circuit which does not appreciably increase the surface of the integrated circuit.

A low noise active load circuit for a bipolar integrated circuit is disclosed. The load circuit has a first terminal which is a power supply, a second terminal which is a ground node and a third terminal which loads an external circuit. A first bipolar transistor has its emitter coupled to the first terminal and its collector coupled to the third terminal. A plurality of second transistors each have an emitter coupled to the first terminal, base and collector coupled to the base of the first transistor and to a load resistor. The load resistor is also coupled to ground.

DETAILED DESCRIPTION OF THE PREFERRED EMBODIMENT

Figure 1:
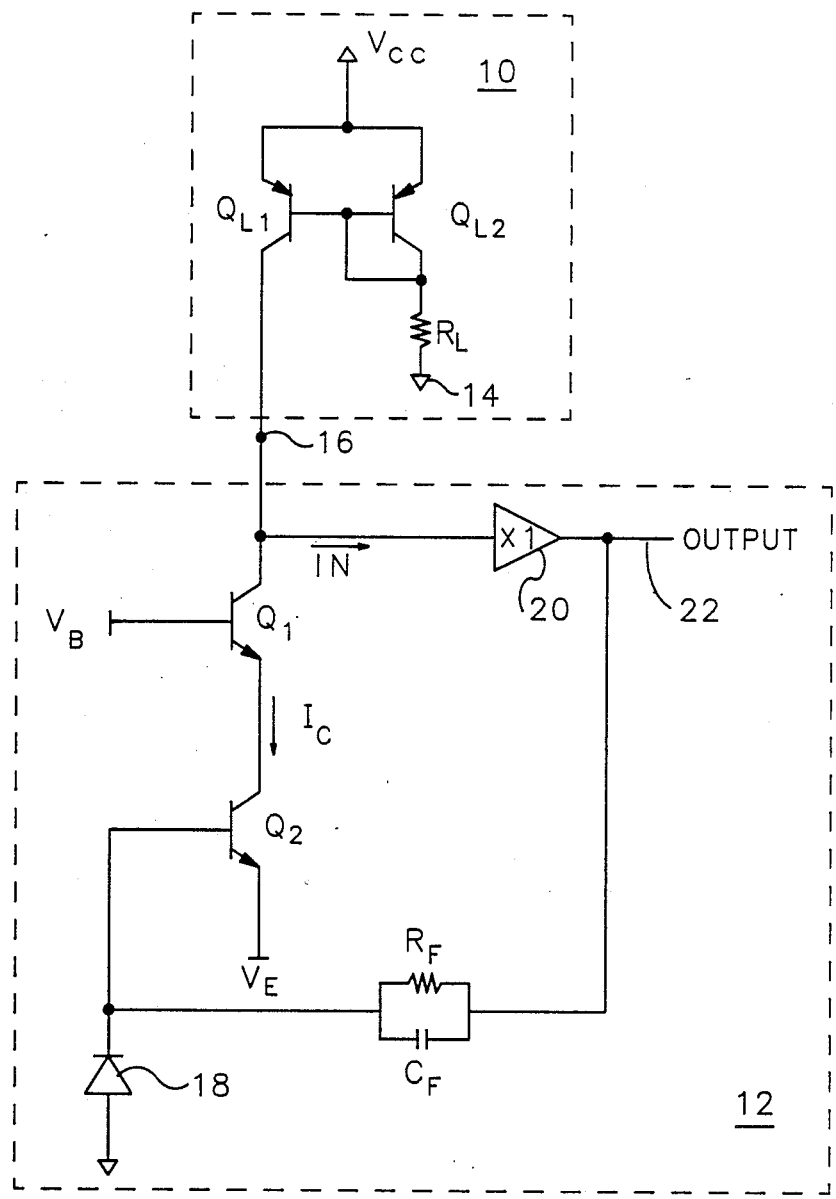
FIG. 1 is a circuit diagram illustrating a prior art active load and a photodiode preamplifier application circuit.
Figure 3:
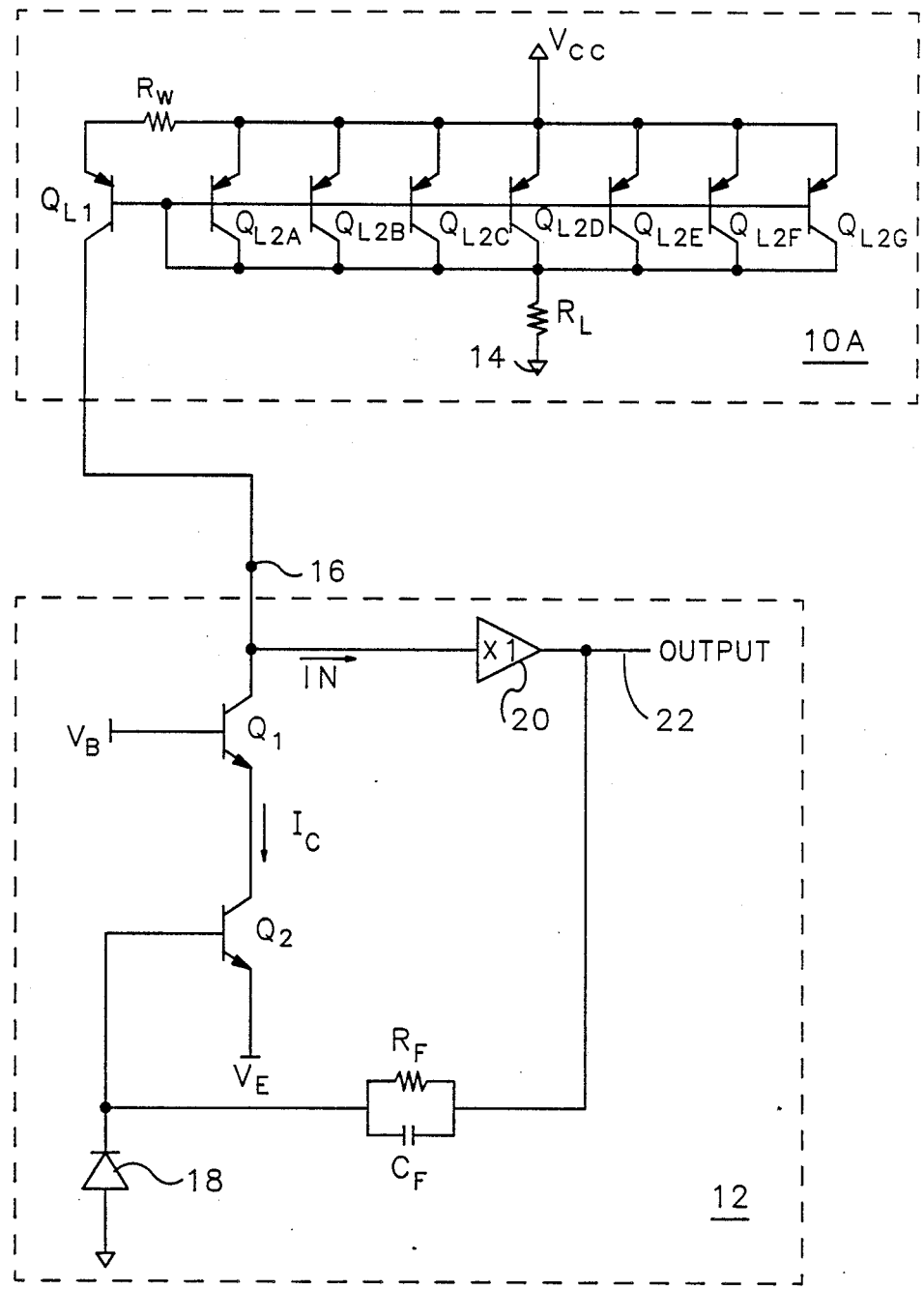
FIG. 3 is a circuit diagram illustrating a preferred embodiment of the present invention.

The preferred embodiment of the present invention shown in FIG. 3 is described relative to the same application circuit 12 shown in the prior art circuit of FIG. 1. The anode terminal of photodiode 18 is coupled to ground 14 and the cathode terminal of photodiode 18 is coupled to the base of transistor $Q_2$ and to one terminal of feedback resistor $R_F$ and feedback capacitor $C_F$. The emitter of transistor $Q_2$ is coupled to a voltage level $V_E$. The collector of transistor $Q_2$ is coupled to the emitter of transistor $Q_1$. The base of transistor $Q_1$ is coupled to voltage supply $V_B$. The collector of transistor $Q_1$ is coupled to loading node 16 and to the input of the gain-of-one op amp 20. The output of op amp 20 is coupled to the output 22 of the photodiode preamplifier circuit 12 and to the other terminal of the feedback resistor RF and the feedback capacitor $C_F$.

The novel active load circuit 10A of the present invention has a voltage supply $V_{CC}$, load transistor $Q_{L1}$, a plurality of load transistors $Q_{L2A}$ through $Q_{L2G}$, load resistor $R_L$ and circuit ground 14. $Q_{L1}$ and $Q_{L2A}$ through $Q_{L2G}$ are PNP transistors. The emitter of $Q_{L1}$ is coupled to the resistor $R_W$. The resistor $R_W$ is also coupled to the voltage supply $V_{CC}$. The collector of transistor $Q_{L1}$ is coupled to the loading node 16 of circuit 12. The bases of each transistor $Q_{L2A}$ through $Q_{L2G}$ is coupled to each other base and each collector of transistors $Q_{L2A}$ through $Q_{L2G}$ and to one terminal of resistor $R_L$. Each emitter of transistor $Q_{L2A}$ through $Q_{L2G}$ is coupled to voltage supply $V_{CC}$. Each base and collector of each transistor $Q_{L2A}$ through $Q_{L2G}$ is coupled to the base of transistor $Q_{L1}$ and to one terminal of resistor $R_L$. The other terminal of resistor $R_L$ is coupled to ground 14.

The active load circuit 10A of FIG. 3 of the present invention operates to reduce the noise introduced into the application circuit 12. As will be clearly understood from the discussion below each component of the active load circuit 10A contributes to the noise introduced into the application circuit 12. The current mirror configuration of the active load circuit 10A reflects the noise generated by the transistors $Q_{L2A}$ through $Q_{L2G}$ and the resistor $R_L$, which are not directly coupled to the application circuit 12, into the application circuit. By forming a plurality of transistors $Q_{L2A}$ through $Q_{L2G}$ such that the current carrying capacity of the side of the current mirror not coupled to the application circuit 12 is greater than the current carrying capacity of the side of the mirror which is so coupled, the amount of noise introduced into the application circuit 12 is reduced proportional to the ratio of those current carrying capacities.

The noise generated in the circuit of FIG. 3 responsive to the active load is derived as described below. It is assumed for this derivation that the resistance $RW = \phi\Omega$. The gain, $\beta$, of each of the transistors is very large; assume that $\beta \to \infty$. Therefore, the noise attributable to each of the base currents is negligible and ignored.

Figure 4:
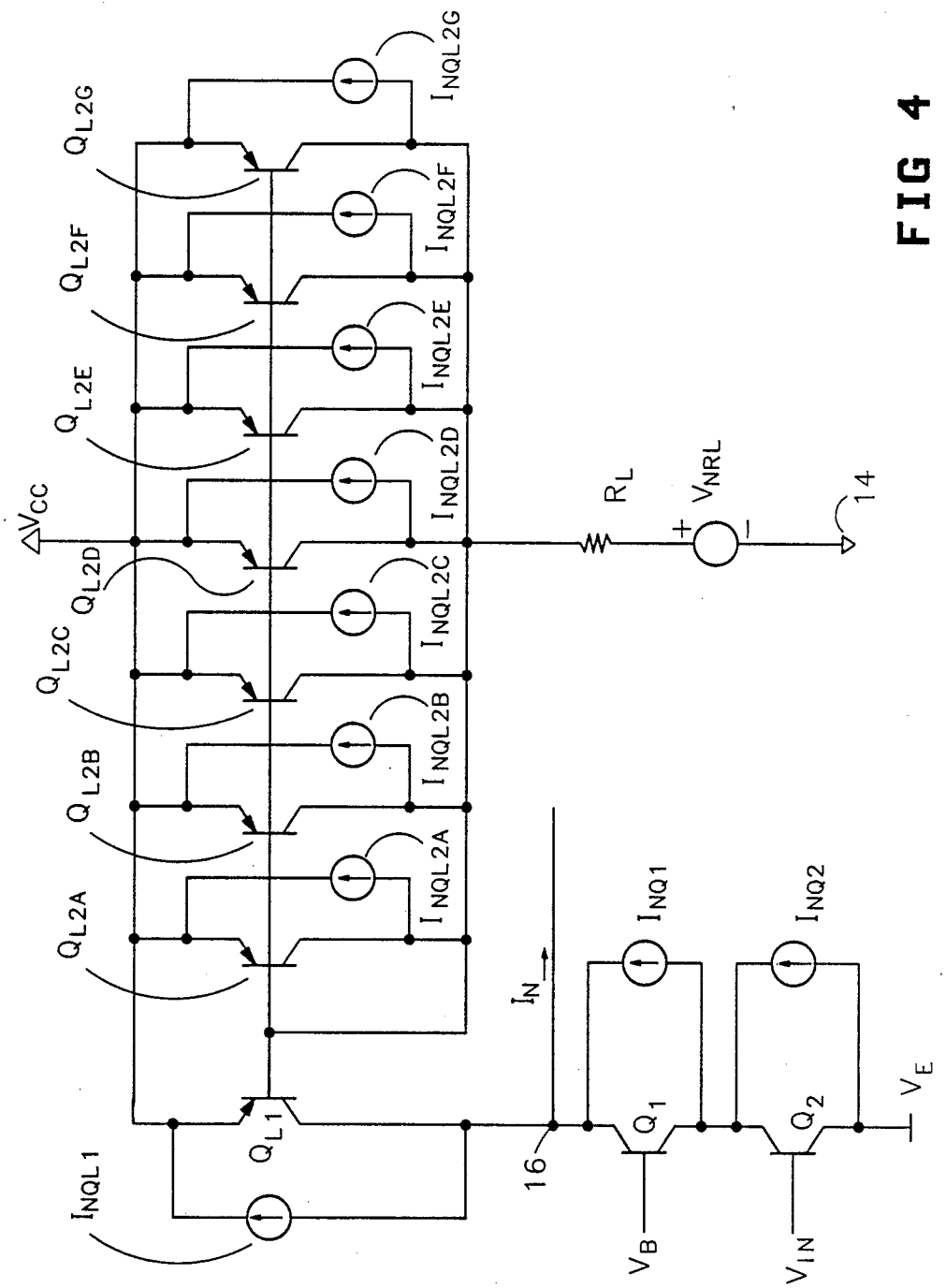
FIG. 4 is a circuit diagram illustrating an equivalent circuit indicating sources of noise.

The noise sources which contribute to the noise seen at node 16 and ultimately at the output 22 are shown in FIG. 4. The circuit of FIG. 4 has the same components as in FIG. 3 and are configured in the same fashion. The emitter of $Q_{L1}$ is coupled to the voltage supply $V_{CC}$. The collector of transistor $Q_{L1}$ is coupled to the loading node 16. The base of transistor $Q_{L1}$ is coupled to the base and collector of each transistor $Q_{L2A}$ through $Q_{L2G}$ and to one terminal of the resistor $R_L$. The emitter of each transistor $Q_{L2A}$ through $Q_{L2G}$ is coupled to the voltage supply $V_{CC}$. The other terminal of the resistor $R_L$ is coupled to ground 14.

The collector of NPN transistor $Q_1$ is coupled to node 16, the base to a biasing voltage $V_B$ and the emitter is coupled to the collector of NPN transistor $Q_2$. The base of transistor $Q_2$ is driven by an input voltage $V_{IN}$. $V_{IN}$ is controlled by the remainder of the application circuit and photodiode not shown in FIG. 4. The emitter of transistor $Q_2$ is coupled to a biasing voltage supply $V_E$.

The sources of noise are shown in FIG. 4 as ten current sources and a voltage source. $I_{NQL1}$ is coupled across transistor $Q_{L1}$ between its collector and emitter. $I_{NQL2A}$ through $I_{NQL2G}$ are coupled across the collector and emitter of each transistor $Q_{L2A}$ through $Q_{L2G}$, respectively. $V_{NRL}$, a noise voltage, is coupled between resistor $R_L$ and ground 14. $I_{NQ1}$ is coupled across transistor $Q_1$ between its collector and emitter. $I_{NQ2}$ is coupled across transistor $Q_2$ between its collector and emitter.

DC voltages represent short circuits to AC signals. Thus, from an AC signal analysis standpoint, any of the noise sources referenced to a DC voltage supply should be referenced to AC signal ground 15. For this reason the circuit analysis for the noise signals relative to the circuit of FIG. 3 and FIG. 4 as seen at node 16 are shown as modified in FIG. 5. The emitter of $Q_{L1}$ is coupled to the voltage supply $V_{CC}$. The collector of transistor $Q_{L1}$ is coupled to the loading node 16. The base of transistor $Q_{L1}$ is coupled to the base and collector of each transistor $Q_{L2A}$ through $Q_{L2G}$ and to one terminal of the resistor $R_L$. The emitter of each transistor $Q_{L2A}$ through $Q_{L2G}$ is coupled to the voltage supply $V_{CC}$. The other terminal of the resistor $R_L$ is coupled to ground 14.

The collector of NPN transistor $Q_1$ is coupled to the node 16, the base to a biasing voltage $V_B$ and the emitter is coupled to the collector of NPN transistor $Q_2$. The base of transistor $Q_2$ is driven by an input voltage $V_{IN}$. $V_{IN}$ is controlled by the application circuit 12 shown in FIG. 3 not shown in FIG. 5. The emitter of transistor $Q_2$ is coupled to a biasing voltage supply $V_E$.

Figure 5:
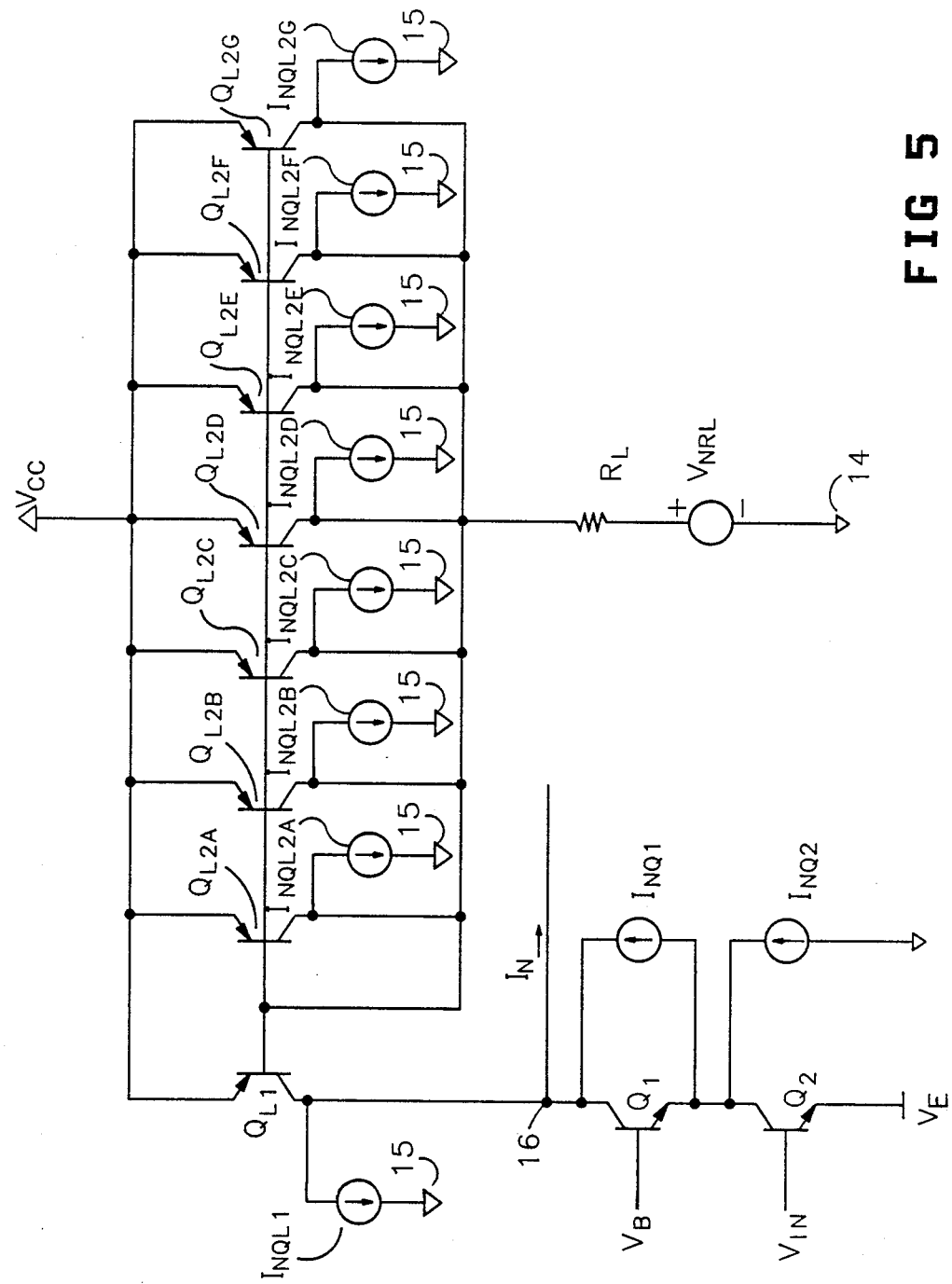
FIG. 5 is a circuit diagram illustrating an equivalent circuit indicating sources of noise in reference to an AC signal ground.

Each of the noise sources coupled to a DC voltage supply in FIG. 4 is shown in FIG. 5 to be coupled to the AC signal ground 15. Current source $I_{NQL1}$ is coupled between the collector of transistor $Q_{L1}$ and AC signal ground 15. The current sources $I_{NQL2A}$ through $I_{NQL2G}$ are coupled between the collector of each transistor $Q_{L2A}$ through $Q_{L2G}$, respectively, and AC signal ground 15. Voltage source $V_{NRL}$ is coupled between resistor $R_L$ and circuit ground 14. Current source $I_{NQ1}$ is not coupled to a DC voltage and so remains coupled across the collector and emitter of transistor $Q_1$. Current source $I_{NQ2}$ is coupled between the collector of transistor $Q_2$ and AC signal ground 15.

Figure 6:
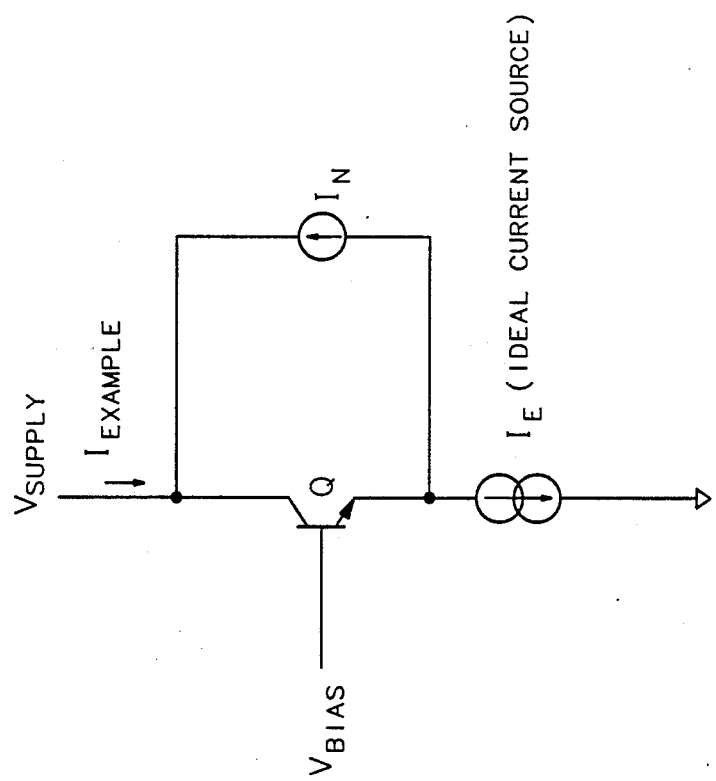
FIG. 6 is a circuit diagram illustrating a single high current gain transistor and a noise source.
Figure 2:
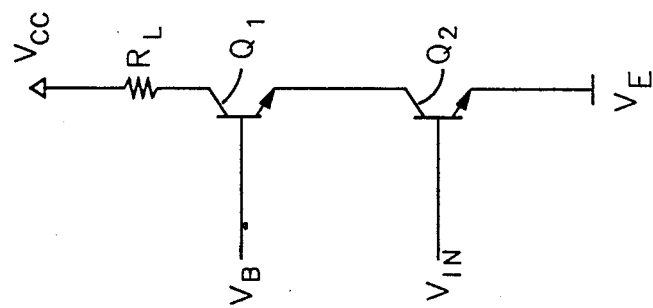
FIG. 2 is a circuit diagram illustrating a prior art method of lowering the noise of FIG. 1, but utilizing excess chip area.

Since $\beta$ for $Q_1$ is large the noise introduced by $Q_1$ is cancelled out. Referring to FIG. 6, the collector of transistor Q is coupled to a supply voltage $V_{supply}$. The emitter of transistor Q is coupled to an ideal current source $I_E$. Transistor $Q_2$ is assumed to operate as the ideal current source $I_E$. The ideal current source is coupled to ground. A biasing voltage $V_{bias}$ is coupled to the base. A current source, $I_N$, (i.e. $I_N$ noise current source) is shown coupled between the emitter and collector of the transistor Q. Applying Kirchoff's current law and the basic fundamentals of bipolar transistors yields the result that the current $I_{example}$ is equal to the sum of the noise signal IN and $\infty_Q * I_N$ as shown by:

$$I_{example} = -I_n + (\alpha * I_N) + (\alpha * I_E)$$

Because $\beta \to \infty$, $\infty \approx 1$.

Therefore, $I_{example} \approx I_E$.

Note that $I_N$ is cancelled.

For this reason, the noise attributable to transistor $Q_1$, $I_{NQ1}$, has no effect on the total noise attributable to the circuit active load $I_N$ shown in FIG. 5.

Referring again to FIG. 5, $Q_1$ is in common base configuration. Therefore, the emitter current is approximately equal to the collector current in $Q_1$. The emitter current in $Q_1$ is exactly equal to the collector current in $Q_2$. Thus, the noise attributable to $Q_2$ is reflected into node 16. The noise attributable to $Q_{L1}$ is coupled to node 16. The voltage noise source $V_{NRL}$ may be configured as a current source, relative to the resistance of resistor $R_L$, which is applied to the collector of transistor $Q_{L2A}$ through $Q_{L2G}$. Because $Q_{L1}$ and $Q_{L2A}$ through $Q_{L2G}$ are each configured as a one-to-one current mirror the noise attributable to $Q_{L2A}$ through $Q_{L2G}$ and to the resistor $R_L$ are also reflected into node 16.

Figure 7:
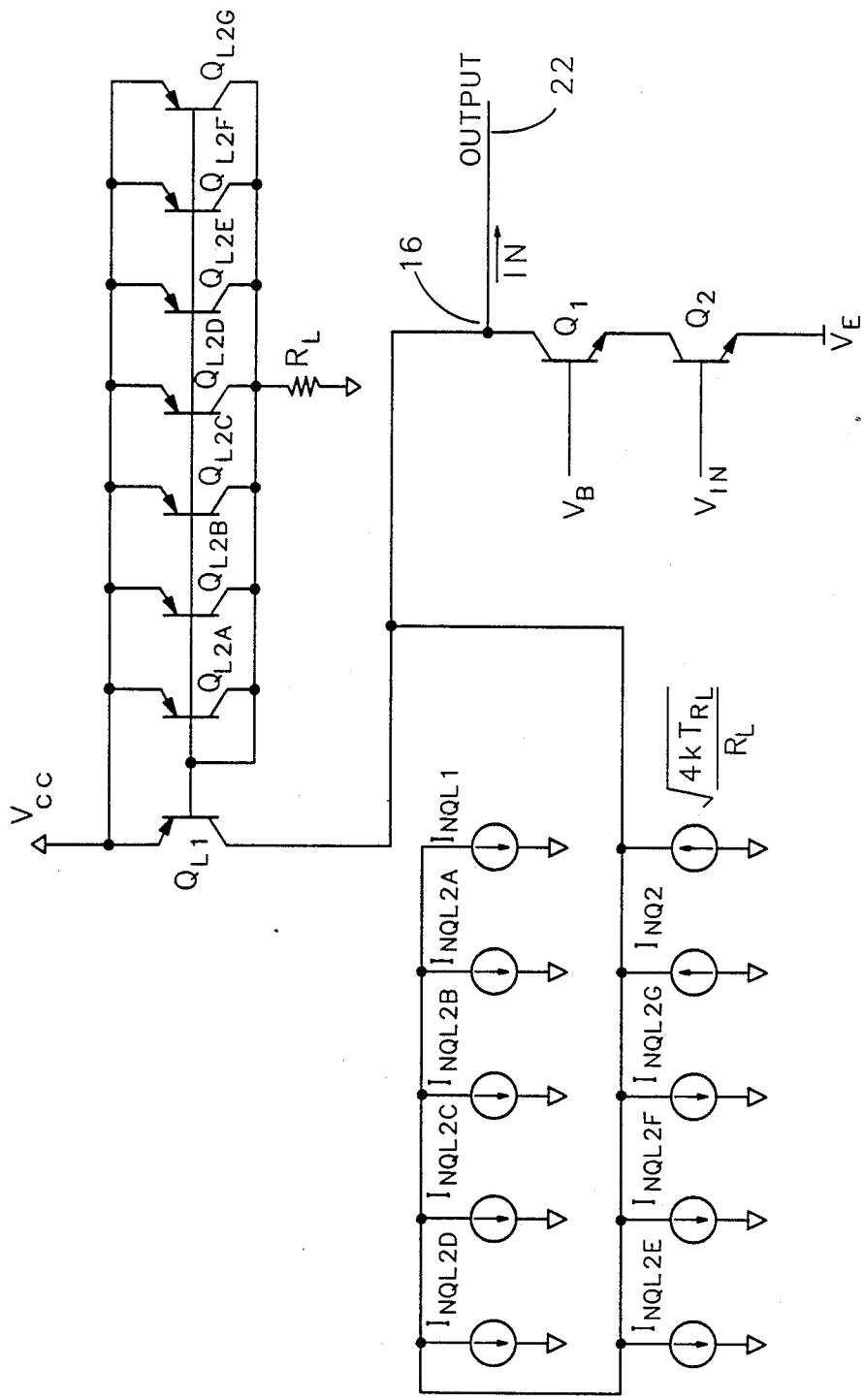
FIG. 7 is a circuit diagram illustrating an equivalent circuit with localized noise sources.

All the noise sources in the circuit of FIG. 3 relative to the active load can be analyzed as if they were applied to node 16 as shown in FIG. 7. The emitter of $Q_{L1}$ is coupled to the voltage supply $V_{CC}$. The collector of transistor $Q_{L1}$ is coupled to the loading node 16 of circuit 12. The base of transistor $Q_{L1}$ is coupled to each base and collector of transistor $Q_{L2A}$ through $Q_{L2G}$ and to one terminal of the resistor $R_L$. The emitter of each transistor $Q_{L2A}$ through $Q_{L2G}$ is coupled to the voltage supply $V_{CC}$. The other terminal of the resistor $R_L$ is coupled to ground 14.

The collector of NPN transistor $Q_1$ is coupled to the node 16, the base to a biasing voltage $V_B$ and the emitter is coupled to the collector of NPN transistor $Q_2$. The base of transistor $Q_2$ is driven by an input voltage $V_{IN}$. $V_{IN}$ is controlled by the remainder of the application circuit and photodiode not shown in FIG. 7. The emitter of transistor $Q_2$ is coupled to a DC voltage supply $V_E$.

Ten current supplies are thus shown coupled between node 16 and AC ground 15. Those current supplies are $I_{NQL1}$, $I_{NQL2A}$ through $I_{NQL2G}$, $I_{NQ2}$ and $\sqrt{4kTR_L}/R_L$ which are coupled between the node 16 and AC signal ground 15. By applying Ohm's law and relying upon the fact that $R_L >> 1/g_{mQL2}$ the noise current attributable to the resistor $R_L$ is approximately equal to the square root of $4kTR_L$ divided by $R_L$.

Because the introduction of noise is a random occurrence the statistical value of the noise appearing at node 16 is given by the square root of the sum of the squares of each individual noise source. Thus, the noise $I_N$ is described by the equation:

$$I_N = \left\{ I^2_{NQ1} + I^2_{NQL1} + (I^2_{NQL2A} + I^2_{NQL2B} + I^2_{NQL2C} + I^2_{NQL2D} + I^2_{NQL2E} + I^2_{NQL2F} + I^2_{NQL2G})/7^2 + \frac{4kTR_L}{R_L^2} \cdot \frac{1}{7^2} \right\}^{\frac{1}{2}}$$

Because the transistors $Q_{L2A}$ through $Q_{L2G}$ are designed to be identical the current through each of the transistors $Q_{L2A}$ through $Q_{L2G}$ must be identical so that $I_{NQL2A} = I_{NQL2B} = \ldots = I_{NQL2G}$. Therefore, the equation above can be written as:

$$I_N = \left\{ I^2_{NQ1} + I^2_{NQL1} + \frac{7(I_{NQL2A})^2}{7^2} + \frac{4kTR_L}{R_L} \cdot \frac{1}{7^2} \right\}^{\frac{1}{2}}$$

or in general;

$$I_N = \left\{ I^2_{NQ1} + I^2_{NQL1} + \frac{n(I_{NQL2A})^2}{n^2} + \frac{4kTR_L}{R_L} \cdot \frac{1}{n^2} \right\}^{\frac{1}{2}}$$

in the above n=7

Because of the current mirror configuration of the active load circuit, the current through each of the transistors $Q_{L2A}$ through $Q_{L2G}$ is identical to the current through transistor $Q_{L1}$. It is clear, therefore, that the noise power for each of the transistors $Q_{L2A}$ through $Q_{L2G}$ is reduced by $1/7^2$ (the number of transistors $Q_{L2A}$ through $Q_{L2G}$) upon being reflected through the current mirror of transistor $Q_{L1}$ and $Q_{L2A}$ through $Q_{L2G}$. For the same reason, the noise power associated with resistor $R_L$ is also reduced by $1/7^2$.

If $I_{QL1}$ is selected to be 5 $\mu A$ and $V_{CC} = 5$ V, $R_L$ must equal 122.9K$\Omega$. $I_N = 1.85$ A/$\sqrt{Hz}$. For a similar 5 $\mu A$ current the prior art circuit would have a noise current $I_N \approx 2.19$ pA/$\sqrt{Hz}$. This is 84% of the noise from the active load circuit of the prior art. The noise was lowered by 1.5 dB. Note by increasing n noise ($I_N$) will decrease.

Figure 8:
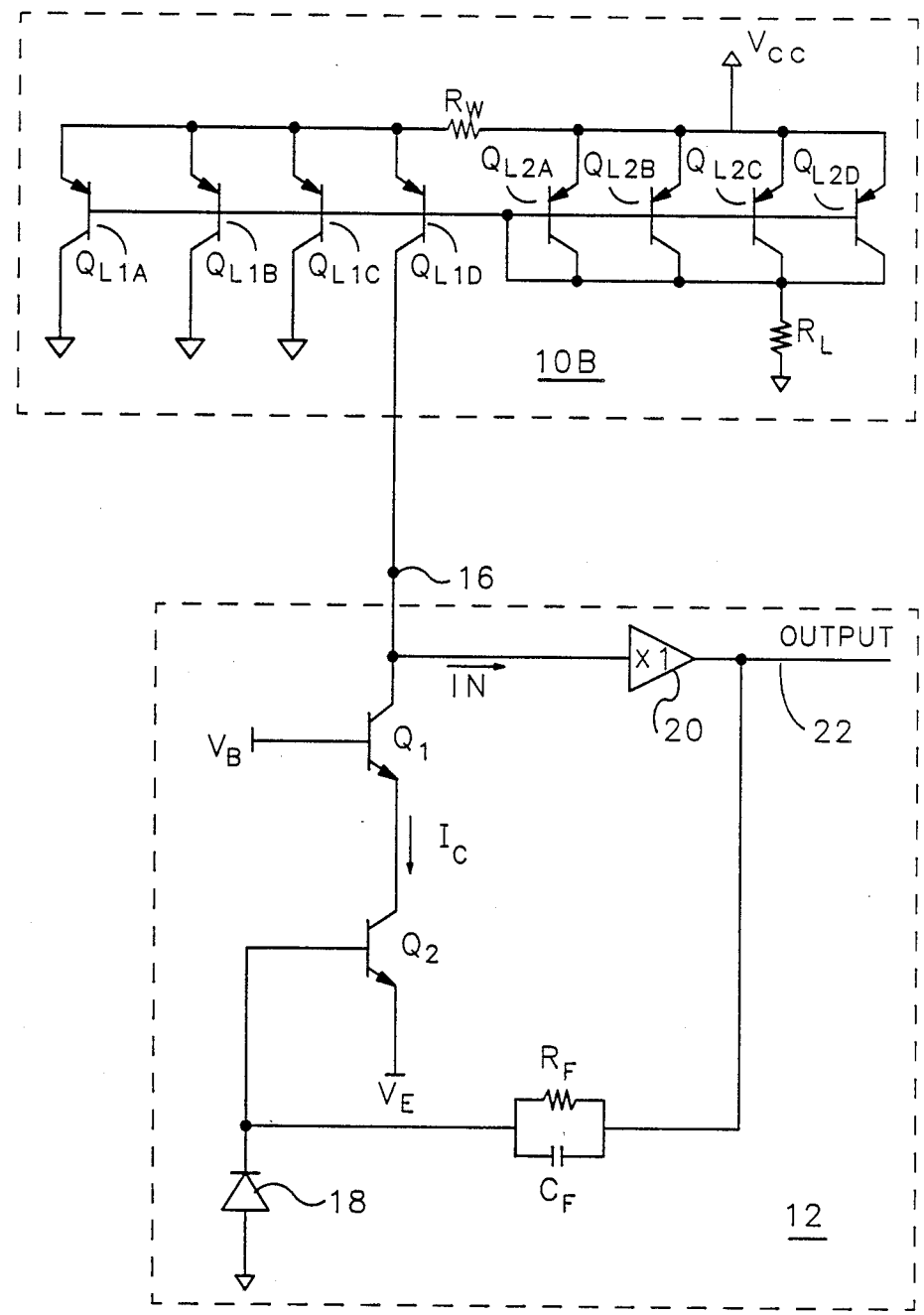
FIG. 8 is a circuit diagram illustrating an alternate embodiment of the present invention.

An alternative embodiment of the present invention is shown in FIG. 8. The circuit of FIG. 8 utilizes the same application circuit 12 as used in FIG. 1 and FIG. 3. The active load circuit shown in FIG. 8 includes a voltage supply $V_{CC}$ a plurality of transistors $Q_{L1A}$ through $Q_{L1D}$, a plurality of transistors $Q_{L2A}$ through $Q_{L2D}$, a load resistor $R_L$, a biasing resistor $R_W$ and a circuit ground 14. Each of the transistors $Q_{L1A}$ through $Q_{L1D}$ and $Q_{L2A}$ through $Q_{L2D}$ are PNP transistors. The emitter of each of the transistors $Q_{L1A}$ through $Q_{L1D}$ is coupled to a terminal of biasing resistor $R_W$. Each collector of transistors $Q_{L1A}$ through $Q_{L1C}$ is coupled to ground. The collector of transistor $Q_{L1D}$ is coupled to loading point 16. The base of each of the transistors $Q_{L1A}$ through $Q_{L1D}$ is coupled to each base and each collector of transistor $Q_{L2A}$ through $Q_{L2D}$. The emitter of each of the transistors $Q_{L2A}$ through $Q_{L2D}$ is coupled to the second terminal of biasing resistor $R_W$ and to the voltage supply $V_{CC}$. The collector of each of the transistors $Q_{L2A}$ through $Q_{L2D}$ is coupled to resistor $R_L$. Resistor $R_L$ is also coupled to circuit ground 14. Each of the transistors $Q_{L1A}$ through $Q_{L1D}$ and $Q_{L2A}$ through $Q_{L2D}$ are preferably designed to be identical.

The same assumptions and reasoning used to derive the noise power factor $I_N$ in the preferred embodiment circuit of FIGS. 3–7 are applied to derive the noise power factor for the alternate embodiment of the present invention shown in FIG. 8.

A noise power source is coupled across each of the transistors $Q_{L1A}$ through $Q_{L1D}$, $Q_{L2A}$ through $Q_{L2D}$, $Q_1$ and $Q_2$. As described above, the noise source across $Q_1$ has no effect on the output of the circuit due to the high beta of the transistors. Two voltage noise sources are coupled in series with resistor $R_W$ and resistor $R_L$, respectively. Each of the noise sources is reference to a DC voltage level and as such can be analyzed with reference to an AC signal ground 16. The transconductance of the circuit is affected by the value of biasing resistor $R_W$. The current through each transistor $Q_{L2A}$ through $Q_{L2D}$ is 25 $\mu A$. The current through each transistor $Q_{L2}$ is greater than the current through each transistor $Q_{L1}$ because of the biasing resistor $R_W$.

The transconductance of the transistors $Q_{L1A}$ through $Q_{L1D}$, $g_{mQL1}$, is 20 $\mu A/kT/q$. The transconductance of the transistors $Q_{L2A}$ through $Q_{L2D}$, $g_{mQL2}$, is 100 $\mu A/kT/q$. The current $I_{NQ2}$ is the sum of the noise through each of the transistors $Q_{L2A}$ through $Q_{L2D}$. The noise current for the circuit of FIG. 8 is:

$$I_N = \left\{ 2qI_{NQ1} + 2qI_{NRL} \cdot U^2 + \frac{4kTR_L}{R_L^2} \cdot U^2 + (I_A)^2 \right\}^{\frac{1}{2}},$$

$$I_A^2 = \frac{4kTR_W}{\left(R_W + \frac{1}{g_{mQL1}}\right)^2} \cdot \frac{1}{n^2} +$$

-continued $$\frac{n-1}{n^2} 2qI_{NQL1D}\left(\frac{R_W}{R_W + \frac{1}{g_{mQL1}}}\right)^2 +$$

$$2qI_{NQL1D}\left(1 - \frac{R_W}{R_W + \frac{1}{g_{mQL1}}} \cdot \frac{1}{n}\right)^2,$$

$$U = \left(\frac{\frac{1}{y}}{1 + \frac{g_{mQL2} \cdot R_W}{y}}\right) \cdot \frac{1}{n},$$

$$y = \frac{g_{mQL1}}{g_{mQL2}}$$

where n = number of transistors $Q_{L1}$ and $Q_{L2}$.
In FIG. 8, n = 4.

If the collector current through each transistor $Q_{L2A}$ to $Q_{L2D}=25$ μA then by setting $R_L=43$ KΩ and $V_{CC}=5$ v, with $R_W=2000Ω$ then the collector current through transistor $Q_{L1D}=5$ μA. Thus, $I_N=1.69$ pA√Hz. This is 77% of the noise current in the prior art circuit. This is a 2.25 dB reduction.

It is clear from the foregoing discussion that the noise introduced from the active load can be reduced by increasing the number of transistors in parallel in the active load circuit.

The present invention may be practiced without identically duplicating the resistor or transistor values or without duplicating the number of parallel load transistors show in the examples above. Many alternative implementations maybe utilized which embody the basis of the present invention.

It is important that the bipolar transistor voltage $V_{BE}$ be matched for each of the transistors $Q_{L1A}$ through $Q_{L1N}$ and for transistors $Q_{L2A}$ through $Q_{L2N}$ (where N is the number of $Q_{L1}$ or $Q_{L2}$ transistors). By appropriate selection of transistors it is possible to practice the present invention with discrete components. The present invention is ideally suited to be manufactured by monolithic integrated circuit techniques. The present invention is better practiced by building individual transistors on an integrated circuit and coupling them as shown in the circuits of FIG. 3 or FIG. 8. However, the preferred method of forming these transistors is to form transistors $Q_{L1A}$ through $Q_{L1N}$ with a single emitter diffusion, a single base diffusion and N collector diffusions formed in the base diffusion, one collector for each transistor. $Q_{L2A}$ through $Q_{L2N}$ are similarly formed. This latter technique clearly reduces the amount of surface area utilized on the integrated circuit for the active load over the prior art technique of adding a large resistance.

An improved low noise integrated active load has been disclosed for bipolar integrated circuits.

What is claimed is:

1. A low noise integrated active load circuit in a current mirror configuration, with noise introduced into the output current by transistors in the bias side of the circuit attenuated, comprising:
   (a) a voltage supply terminal;
   (b) a ground potential terminal;
   (c) an output terminal connected to an external circuit;
   (d) a bias resistor having a first resistor terminal and a second resistor terminal said first resistor terminal connected to said ground potential terminal;
   (e) a first output transistor having a first collector, a first base and a first emitter, said first emitter coupled to said voltage supply terminal and said first collector coupled to said output terminal, said first transistor being a PNP bipolar transistor; and
   (f) a plurality of n bias transistors each having a second collector, a second base and a second emitter, each of said second emitters coupled to said voltage supply terminal, each of said second bases coupled to said first base and to said second resistor terminal, and each of said second collectors coupled to said second resistor terminal, said n bias transistors each being a PNP bipolar transistor;
   (g) a third transistor having a third collector, a third base and a third emitter, said third transistor being a PNP transistor, said third emitter coupled to said first emitter, said third base coupled to said first base and said third collector coupled directly to said ground potential terminal;
   (h) said output transistor having an output current determined by 1/n times the current through the bias resistor, and
   (i) each of said n bias transistors contributing to the noise in the current through the bias resistor, to produce a net noise component in the current through the resistor less than n times the noise contribution of one of the n bias transistors, whereby the noise in the output current contributed by the plurality of bias transistors is less than the noise a single bias transistor would contribute.

2. The low noise integrated active load circuit according to claim 1 wherein the transconductance of the first transistor is increased to a larger value than the transconductance of the second transistors by a second bias resistor coupled between said first emitter and said voltage supply terminal.

3. A low noise integrated active load circuit in a current mirror configuration, with noise introduced into the output current by transistors in the bias side of the circuit attenuated, comprising;
   (a) a DC power supply terminal;
   (b) a voltage ground terminal;
   (c) a loading terminal connected to an external circuit;
   (d) a first bias resistor having a first resistor terminal and a second resistor terminal said first resistor terminal connected to said ground terminal;
   (e) a first output transistor having a first collector, a first base and a first emitter, said first emitter coupled to said power supply terminal and said first collector coupled to said loading terminal;
   (f) a plurality of n bias transistors each having a second collector, a second base and a second emitter, each of said second emitters coupled to said power supply terminal, each of said second bases coupled to said first base, and each of said second collectors coupled to said second resistor terminal; and
   (g) a third transistor having a third collector, a third base and a third emitter, said third emitter coupled to said first emitter, said third base coupled to said first base and said third collector coupled directly to said ground terminal.

4. The low noise integrated active load circuit according to claim 3 wherein the transconductance of the first transistor is increased to a larger value than the transconductance of the second transistors by a second bias resistor coupled between said first emitter and said voltage supply terminal.

* * * * *

UNITED STATES PATENT AND TRADEMARK OFFICE
CERTIFICATE OF CORRECTION

PATENT NO. : 4,963,764
DATED : October 16, 1990
INVENTOR(S) : Ronald Quan

It is certified that error appears in the above-identified patent and that said Letters Patent is hereby corrected as shown below:

Column 2, line 62, "RF" should read --$R_F$--.

Column 3, line 33, "RW" should read --$R_W$--.

Column 4, line 47, "IN" should read --$I_N$--; line 49, "-$I_n$" should read --"-$I_N$--; line 51, "∞ ≈ 1" should read --∝ ≈ 1--.

Column 5, line 24, "$\sqrt{4kTR_L}/R_L$" should read --$\sqrt{4kTR_L}/R_L$--; line 47, "=$_{INQL2B}$=...=$_{INQL2G}$." should read --=$I_{NQL2B}$=...=$I_{NQL2G}$.--.

Column 6, line 4, "1.85 A/√Hz" should read --1.85 pA/$\sqrt{Hz}$--; line 6, "pA/√Hz" should read --pA/$\sqrt{Hz}$--.

Column 7, line 5, that portion reading "gmQL1" should read --$g_{mQL1}$--.

Signed and Sealed this

Twenty-ninth Day of December, 1992

Attest:

DOUGLAS B. COMER

*Attesting Officer*      *Acting Commissioner of Patents and Trademarks*